(12) United States Patent
Chen et al.

(10) Patent No.: US 11,705,178 B2
(45) Date of Patent: Jul. 18, 2023

(54) METHOD AND APPARATUS FOR DETERMINING REFRESH COUNTER OF DYNAMIC RANDOM ACCESS MEMORY (DRAM)

(71) Applicant: CHANGXIN MEMORY TECHNOLOGIES, INC., Hefei (CN)

(72) Inventors: Jing Chen, Hefei (CN); Wei-Chou Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/659,708

(22) Filed: Apr. 19, 2022

(65) Prior Publication Data

US 2023/0122701 A1    Apr. 20, 2023

(30) Foreign Application Priority Data

Oct. 20, 2021    (CN) .......................... 202111222328.4

(51) Int. Cl.
*G11C 11/406*    (2006.01)
*G11C 11/4096*    (2006.01)

(52) U.S. Cl.
CPC .... *G11C 11/40615* (2013.01); *G11C 11/4096* (2013.01)

(58) Field of Classification Search
CPC ...................... G11C 11/40615; G11C 11/4096

USPC ......................................................... 365/222
See application file for complete search history.

(56) References Cited

U.S. PATENT DOCUMENTS 7,692,994 B2    4/2010 Pyeon
2007/0242546 A1*  10/2007 Koshikawa ........... G11C 11/406
                                                   365/222

FOREIGN PATENT DOCUMENTS

CN            101432817 B      5/2012

\* cited by examiner

*Primary Examiner* — Huan Hoang
(74) *Attorney, Agent, or Firm* — Cooper Legal Group, LLC

(57) ABSTRACT

Embodiments of the present application provide a method and apparatus for determining a refresh counter of a DRAM. The method includes: writing data to a target memory cell connected with a target word line in the DRAM, and controlling the DRAM to perform refreshes starting from a preset word line according to a preset rule; determining, according to whether the data can be read accurately from the target memory cell after the refreshes, an intermediate refresh counter of refreshes on the target word line; and controlling, based on the intermediate refresh counter, the DRAM to perform refreshes starting from the target word line according to the preset rule, and determining the refresh counter of the DRAM according to whether the data can be read accurately from the target memory cell after the refreshes.

16 Claims, 5 Drawing Sheets

US 11,705,178 B2

METHOD AND APPARATUS FOR DETERMINING REFRESH COUNTER OF DYNAMIC RANDOM ACCESS MEMORY (DRAM)

CROSS-REFERENCE TO RELATED APPLICATION

This application claims the priority of Chinese Patent Application No. 202111222328.4, submitted to the Chinese Intellectual Property Office on Oct. 20, 2021, the disclosure of which is incorporated herein in its entirety by reference.

TECHNICAL FIELD

The present application relates to the technical field of memories, and in particular to a method and apparatus for determining a refresh counter of a dynamic random access memory (DRAM).

BACKGROUND

A DRAM is provided with a plurality of memory cells, each of which can use the amount of charge stored in the capacitor to represent whether a binary bit is 1 or 0.

In the related art, due to electric leakage of the memory cells in the DRAMs, the amount of charge stored in the capacitors will change, and the DRAMs need to refresh the memory cells to maintain the amount of charge in the capacitors of the memory cells. For example, according to a plurality of word lines (WLs) connected with the memory cells and a preset rule, the DRAMs can cyclically refresh the WLs in sequence from a preset WL.

However, how to determine a refresh counter of the DRAM is a technical problem to be urgently solved in the art.

SUMMARY

A first aspect of the present application provides a method for determining a refresh counter of a DRAM, wherein the DRAM is configured to cyclically refresh a plurality of WLs in the DRAM in sequence from a preset WL according to a preset rule, and the method includes: writing data to a target memory cell connected with a target WL in the plurality of WLs; controlling the DRAM to perform refreshes on the plurality of WLs starting from the preset WL according to the preset rule, and determining an intermediate refresh counter according to whether the data can be read from the target memory cell after a plurality of refreshes, wherein the intermediate refresh counter is a counter that the DRAM performs refreshes starting from the preset WL to the target WL according to the preset rule; and controlling, based on the intermediate refresh counter, the DRAM to perform refreshes on the plurality of WLs starting from the target WL according to the preset rule, and determining the refresh counter of the DRAM according to whether the data can be read from the target memory cell after the refreshes, wherein the refresh counter is a counter that the DRAM performs refreshes starting from the target WL to the target WL again according to the preset rule.

A second aspect of the present application provides an apparatus for determining a refresh counter of a DRAM, which may be configured to implement the method provided in the first aspect of the present application, and includes: one or more processors; and a storage apparatus, configured to store one or more programs, wherein the one or more programs, when executed by the one or more processors, cause the one or more processors to execute operations of:

writing data to memory cells of the DRAM; reading the data from the memory cells of the DRAM; performing refreshes on a plurality of WLs of the DRAM according to a preset rule; and writing data to a target memory cell connected with a target WL in the plurality of WLs; performing refreshes on the plurality of WLs starting from a preset WL according to the preset rule, and determining an intermediate refresh counter according to whether the data can be read from the target memory cell after a plurality of refreshes, wherein the intermediate refresh counter is a counter that the DRAM performs refreshes starting from the preset WL to the target WL according to the preset rule; and further controlling, based on the intermediate refresh counter, the DRAM to perform refreshes on the plurality of WLs starting from the target WL according to the preset rule, and determining the refresh counter of the DRAM according to whether the data can be read from the target memory cell after the refreshes, wherein the refresh counter is a counter that the DRAM performs refreshes starting from the target WL to the target WL again according to the preset rule.

BRIEF DESCRIPTION OF THE DRAWINGS

To describe the technical solutions in the embodiments of the present application or in the prior art more clearly, the following briefly describes the accompanying drawings required for describing the embodiments or the prior art. Apparently, the accompanying drawings in the following description show some embodiments of the present application, and those of ordinary skill in the art may still derive other drawings from these accompanying drawings without creative efforts.

DETAILED DESCRIPTION

The technical solutions in embodiments of the present application are described below clearly and completely with reference to the drawings in the embodiments of the present application. Apparently, the described embodiments are merely part rather than all of the embodiments of the present application. All other embodiments obtained by those of ordinary skill in the art based on the embodiments of the present application without creative efforts should fall within the protection scope of the present application.

The terms "first", "second", "third" and so on (if any) in the specification, claims and the accompanying drawings of the present application are intended to distinguish between similar objects but do not necessarily indicate a specific order or sequence. It should be understood that the data used in such a way may be exchanged under proper conditions to make it possible to implement the described embodiments of the present application in other sequences apart from those illustrated or described here. Moreover, the terms "include", "contain", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Figure 1:
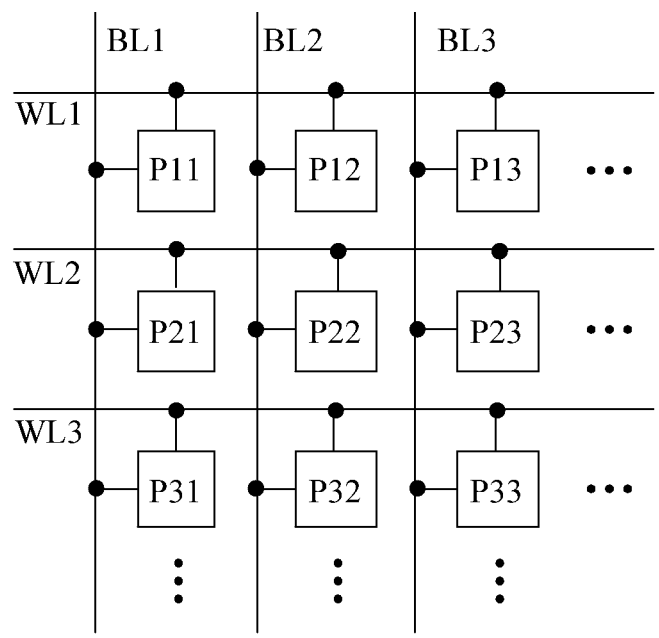
FIG. 1 is a schematic diagram of an application scenario according to the present application.

FIG. 1 is a schematic diagram of an application scenario according to the present application. FIG. 1 illustrates a schematic structural diagram of a DRAM to which the present application is applied. The DRAM is provided with a plurality of memory cells, each of which can use the amount of charge stored in the capacitor to represent whether a binary bit is 1 or 0.

For example, concerning the DRAM shown in FIG. 1, the plurality of memory cells may be arranged in a row and column matrix, and tagged as P11, P12, P13 . . . according to the distribution rule of the row and column matrix. Each of the memory cells in the DRAM is connected to one of a plurality of WLs and one of a plurality of BLs which are also arranged in a row and column matrix. In FIG. 1, the plurality of WLs in rows are tagged as WL1, WL2, WL3 . . . , and the plurality of BLs in columns are tagged as BL1, BL2, BL3 . . . . The plurality of memory cells are provided between adjacent WLs and BLs. The first row of memory cells are connected to the WL1, the second row of memory cells are connected to the WL2, and so forth. The first column of memory cells are connected to the BL1, the second column of memory cells are connected to the BL2, and so forth.

In some embodiments, the WLs and the BLs in the embodiment of the present application may also be other connecting lines, or other names. There are no limits made on specific implementations of the connecting lines. For example, the WLs in FIG. 1 may be tagged as a plurality of first connecting lines and the BLs may be tagged as a plurality of second connecting lines and the like, provided that the connecting lines may function as the WLs or the BLs.

Figure 2:
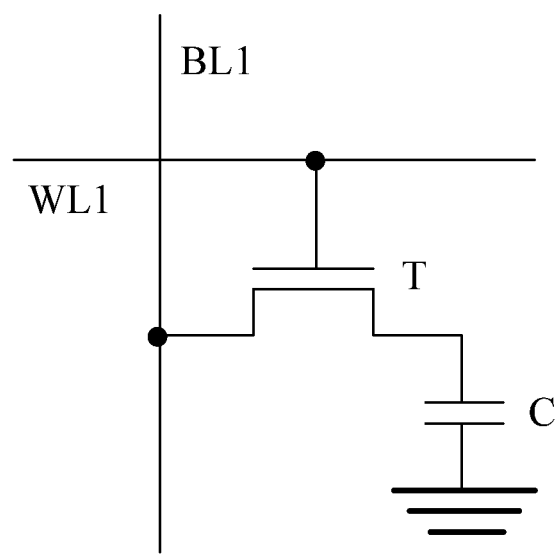
FIG. 2 is a schematic diagram of an equivalent circuit of a memory cell.

In some embodiments, FIG. 2 is a schematic diagram of an equivalent circuit of a memory cell. As shown in FIG. 2, with the memory cell P11 in the first row and first column of the DRAM shown in FIG. 1 as an example, the memory cell includes: a transistor T and a capacitor C. When data is written to the memory cell P11 shown in FIG. 2, a high level is applied to the WL1 and a low level is applied to the BL1 in response to written data "1", such that the transistor T is connected and the capacitor C stores charges. A low level is applied to the WL1 and a low level is applied to the BL1 in response to written data "0", such that the transistor T is connected and the capacitor C releases charges. When the data in the memory cell P11 is read, whether the corresponding data in the memory cell P11 is "1" or "0" can be determined according to whether the capacitor C stores the charges.

Figure 3:
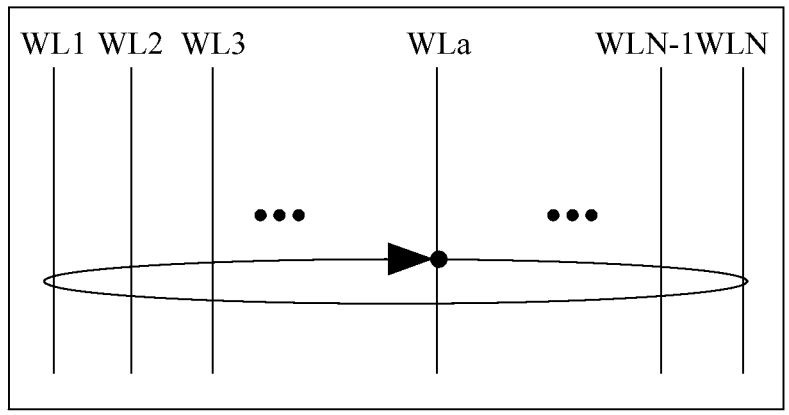
FIG. 3 is a schematic diagram of a refresh of a DRAM.

According to the same manner shown in FIG. 2, all memory cells in the DRAMs determine the corresponding data according to the charges stored in the capacitors. However, due to electric leakage, the capacitors cannot retain the charges for a long time, and the DRAMs needs to refresh all memory cells constantly to maintain the amount of charge in the capacitors of the memory cells. For example, FIG. 3 is a schematic diagram of a refresh of a DRAM. Assuming that there are N WLs in the DRAM that are respectively tagged as WL1, WL2, WL3 . . . WLN−1 and WLN, the DRAM in the refreshes may take any WLa as a start preset WL, and circularly refresh the WLs of the DRAM in sequence from the preset WL according to a preset order. The preset order may start from the WLa and refresh the next WL; and upon the refresh on the Nth WL WLN, it starts from the first WL WL1 and refresh the next WL, until the WLa is refreshed again. In this case, a refresh cycle is ended.

During the refreshes of the DRAMs, both the preset WL WLa for starting the cycle and the preset order WLa-WLN-WL1 in the cycle may be set by different DRAM manufacturers. Users and researchers of the DRAM are uncertain to the preset WL for starting the refresh of the DRAM, the preset order in the cycle, and the refresh counter of the DRAM in one refresh cycle, such that they cannot analyze the DRAM effectively to affect the subsequent use, test and research of the DRAM.

Therefore, the present application provides a method and apparatus for determining a refresh counter of a DRAM, which can determine the refresh counter of the DRAM accurately, evaluate and test the DRAM more effectively according to the refresh counter, and has better analysis on the DRAM. The technical solutions of the present application will be described below in detail with specific embodiments. The following specific embodiments may be combined with each other, in which same or similar concepts or processes may not be repeated in some embodiments.

Figure 4:
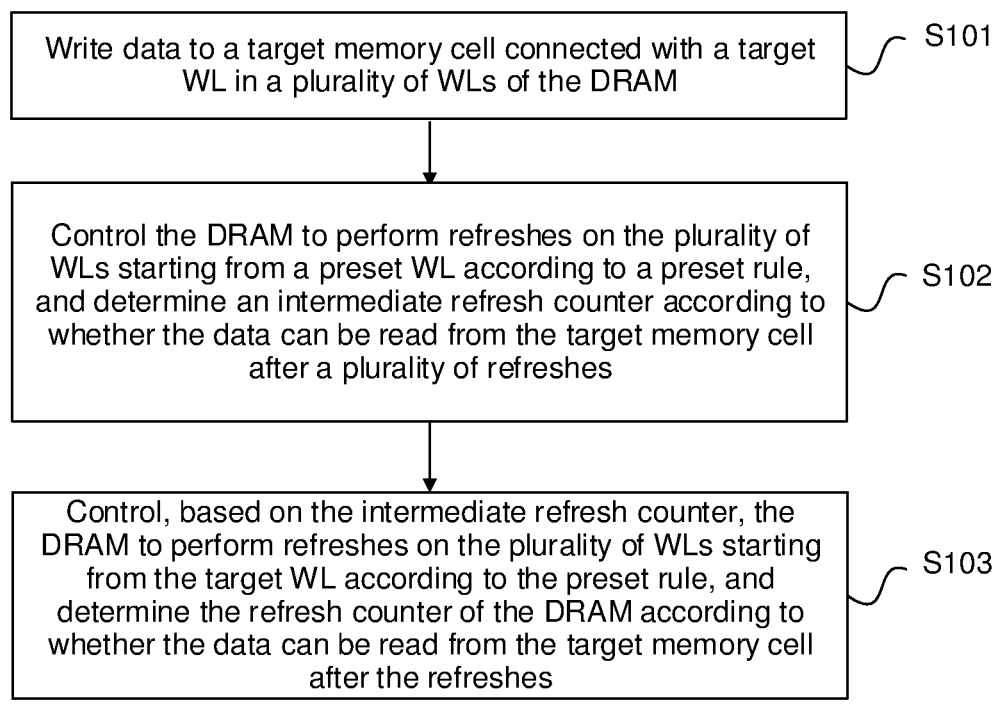
FIG. 4 is a schematic flowchart of a method for determining a refresh counter of a DRAM according to an embodiment of the present application.

FIG. 4 is a schematic flowchart of a method for determining a refresh counter of a DRAM according to an embodiment of the present application. The method shown in FIG. 4 can be used to determine the refresh counter of the DRAM shown in FIGS. 1-2. The execution main body of the method may be any electronic device having a relevant data processing capability, such as computer, server, and workstation. The embodiment of the present application takes the electronic device as the execution main body for example. Specifically, as shown in FIG. 4, the method for determining a refresh counter of a DRAM includes the following:

S101: The electronic device writes data to a target memory cell connected with a target WL in a plurality of WLs of the DRAM.

The DRAM may cyclically perform refreshes on the plurality of WLs in the DRAM at a time starting from a preset WL according to the manner shown in FIG. 3. In order to determine the refresh counter in the DRAM, data is written to the target memory cell first in S101.

In some embodiments, the target memory cell determined in S101 is a memory cell having a retention performance at a normal temperature same as a preset retention performance in all memory cells of the DRAM. The preset retention performance may be 5 s.

Figure 5:
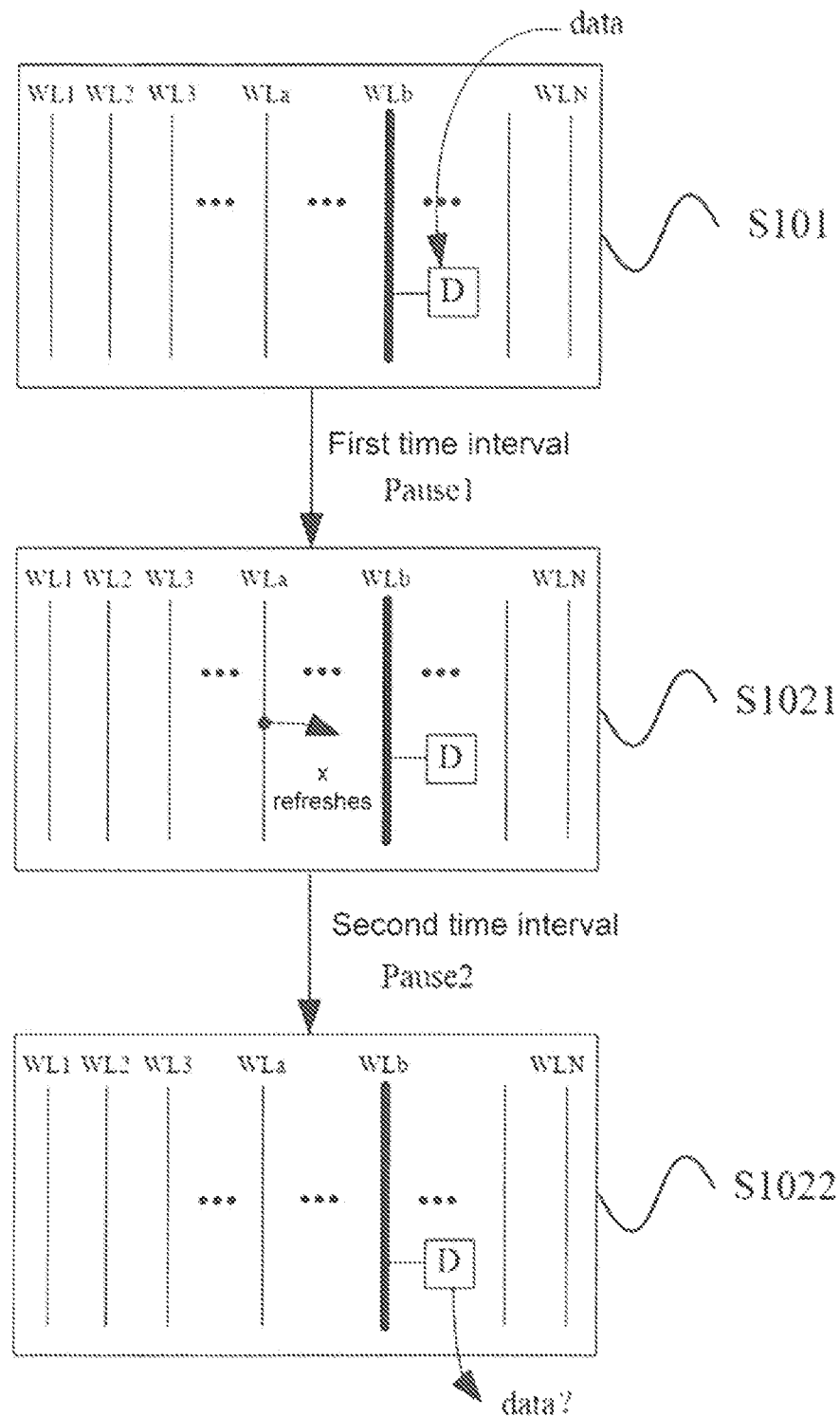
FIG. 5 is a schematic diagram of a process for determining a refresh counter of a DRAM according to the present application.

Exemplarily, FIG. 5 is a schematic diagram of a process for determining a refresh counter of a DRAM according to the present application. In S101, after the target memory cell D is determined according to the preset retention performance, data is written to the target memory cell D, by running a test program and the like, according to addresses of a target WL (WLb) and a target BL that are connected with the target memory cell D.

S102: The electronic device controls the DRAM to perform refreshes on the plurality of WLs starting from a preset WL according to a preset rule, and determines an intermediate refresh counter according to whether the data can be read from the target memory cell after a plurality of refreshes.

With uncertainties to the refresh counter of the DRAM and the preset WL from which the DRAM starts the refreshes, the electronic device can control the DRAM to start the refreshes after writing the data to the target WL in S101. The DRAM performs the refreshes starting from the preset WL according to a preset order. Whenever the DRAM performs the refreshes, the electronic device reads the data from the target memory cell according to the address of the target memory cell. Thereafter, the electronic device can constantly increase the counter of refreshes of the DRAM to obtain the intermediate refresh counter. The intermediate refresh counter refers to a counter that the DRAM performs refreshes starting from the preset WL to the target WL according to the preset rule. Specifically, when the refresh counter of the DRAM is less than the intermediate refresh counter, the electronic device cannot read the data in S101 from the target memory cell, indicating that the DRAM does not perform the refreshes on the target WL where the target memory cell is located. When the refresh counter is the same as the intermediate refresh counter, the electronic device may read the data in S101 from the target memory cell, indicating that when cyclically performing the refreshes starting from the preset WL, the DRAM refreshes the target WL where the target memory cell is located.

In some embodiments, referring to S1021-S1022 in FIG. 5, the present application further provides a manner for determining the intermediate refresh counter in S102. After writing the data to the target memory cell D connected with the target WL WLb of the DRAM in S101, the electronic device stays for a first time interval Pause1 that may be obtained by controlling special idle time in a read-write command of a test program. After the first time interval upon S101, the electronic device controls the DRAM to perform x refreshes on the plurality of WLs starting from the preset WL according to the preset rule of the DRAM in S1021. After a second time interval Pause2 upon S1021, the electronic device determines the intermediate refresh counter X according to whether the data in S101 can be read from the target memory cell D of the DRAM in S1022.

The process of S101-S1022 in FIG. 5 can be executed repeatedly. Whenever the process of S101-S1022 is executed from x=1, if the data in S101 cannot be read from the target memory cell D of the DRAM, a constant a is added to the x to obtain the modified x, and then the process of S101-S1022 is executed again based on the modified x. In some embodiments, 0≤x≤X, a being a natural number greater than 0, such as a=1. The x is modified and the process is executed cyclically, until the data in S101 can be read from the target memory cell D of the DRAM after the process of S101-S1022 is executed based on the modified x. The modified x herein is used as the intermediate refresh counter X.

In some embodiments, the first time interval Pause1 and the second time interval Pause2 at least meet the following conditions: Condition a: a sum of the first time interval Pause1 and the second time interval Pause2 is greater than a retention performance of the target memory cell D. Preferably, the sum of the first time interval Pause1 and the second time interval Pause2 is 1.2-1.8 times the retention performance of the target memory cell D. Condition b, the first time interval Pause1 is less than the retention performance of the target memory cell D. Condition c, the second time interval Pause2 is less than the retention performance of the target memory cell D. Preferably, the first time interval Pause1 may fall within a range of 3,500 ms≤Pause1≤5,200 ms, and the second time interval Pause2 may fall within a range of 2,500 ms≤Pause2≤4,500 ms.

In the process shown in FIG. 5, the first time interval Pause1 and the second time interval Pause2 follow the condition a and the condition c. If the refreshes starting from the preset WL WLa by the DRAM in S1021 are not be performed on the target WL WLb through x refreshes after the data is written to the target memory cell D of the DRAM, as the sum of the first time interval Pause1 and the second time interval Pause2 is greater than the retention performance of the target memory cell D, charges in the capacitor of the memory cell have been consumed when the data in the target memory cell D is read in S1022. Consequently, the data cannot be read accurately from the target memory cell D. If the refreshes starting from the preset WL WLa by the DRAM in S1021 are performed on the target WL WLb through x refreshes, even though the sum of the first time interval Pause1 and the second time interval Pause2 is greater than the retention performance of the target memory cell D, charges in the capacitor of the target memory cell D are retained because the target WL WLb is refreshed in S1021 between the first time interval Pause1 and the second time interval Pause2 and the first time interval Pause1 and the second time interval Pause2 do not exceed the retention performance of the target memory cell D. Consequently, the data can be read accurately from the target memory cell D in S1022.

Further, the refresh counter x in S1021 is constantly increased, until the data can be read from the target memory cell D accurately after the refresh is performed with the modified x. The x herein can be considered as the intermediate refresh counter X of refreshes starting from the preset WL WLa by the DRAM just on the target WL WLb according to the preset rule.

S103: The electronic device controls, based on the intermediate refresh counter determined in S102, the DRAM to perform refreshes on the plurality of WLs starting from the target WL according to the preset rule, and determines the refresh counter of the DRAM according to whether the data in S101 can be read from the target memory cell after the refreshes.

After determining the intermediate refresh counter of the refreshes on the target WL by the DRAM starting from the preset WL according to the preset order, the electronic device may control the DRAM to perform refreshes for the intermediate refresh counter, namely control the DRAM to perform the refreshes starting from the target WL. Although the preset rule for the refreshes of the DRAM is not known, the preset WL from which the DRAM performs the refreshes is determined. The electronic device controls the DRAM to perform the refreshes starting from the target WL, and can continuously increase the counter of refreshes of the DRAM to obtain the refresh counter of the DRAM. The refresh counter of the DRAM is a counter that the DRAM performs refreshes starting from the target word line to the target WL again according to the preset rule, namely a counter of refreshes on the preset WL again by the DRAM starting from the preset WL according to the preset rule.

Figure 6:
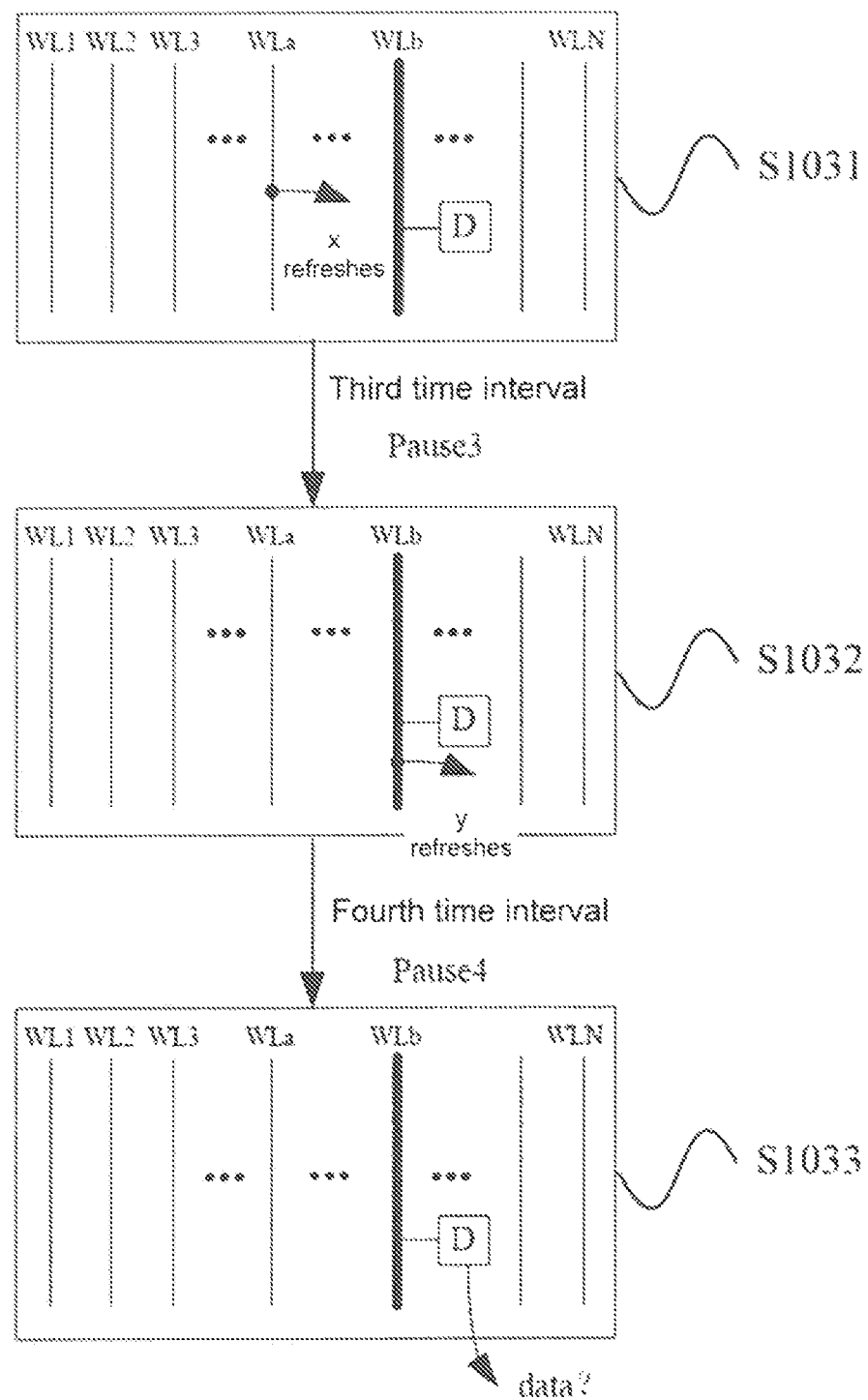
FIG. 6 is a schematic diagram of another process for determining a refresh counter of a DRAM according to the present application.

In some embodiments, the present application further provides a manner for determining a refresh counter of a DRAM in S103. FIG. 6 is a schematic diagram of another process for determining a refresh counter of a DRAM according to the present application. After the intermediate refresh counter is determined in S102, data may be rewritten to the target memory cell and S103 is executed, or S103 is executed directly after S102 because the target WL is refreshed in S102. Referring to S1031-S1033 in FIG. 6, in S1031, the electronic device controls the DRAM to perform X refreshes on the plurality of WLs starting from the preset WL WLa according to the preset rule of the DRAM, X being the intermediate refresh counter determined in S102. After the X refreshes, the DRAM performs the refreshes on the target WL WLa. The electronic device stays for a third time interval Pause3 that may be obtained by controlling special idle time in a read-write command of a test program. After the third time interval upon S1031, the electronic device controls the DRAM to perform refreshes in S1032. As the DRAM performs the refreshes on the target WL WLb before the third time interval, the DRAM continues to perform y refreshes on the plurality of WLs starting from the target WL WLb according to the preset rule. After a fourth time interval Pause4 upon S1032, the electronic device determines the refresh counter Y of the DRAM according to whether the written data can be read from the target memory cell D of the DRAM in S1033.

The process of S1031-S1033 in FIG. 6 can be executed repeatedly. Whenever the process of S1031-S1033 is executed from x=1, if the written data cannot be read from the target memory cell D of the DRAM, a constant b is added to the y to obtain the modified y, and then the process of S1031-S1033 is executed again based on the modified y. In some embodiments, 0≤x≤Y, b being a natural number greater than 0, such as b=1. The y is modified and the process is executed cyclically, until the written data can be read from the target memory cell D of the DRAM after the process of S1031-S1033 is executed based on the modified y. The modified y herein is used as the refresh counter Y of the DRAM.

In some embodiments, the third time interval Pause3 and the fourth time interval Pause4 at least meet the following conditions: Condition d: a sum of the third time interval Pause3 and the fourth time interval Pause4 is greater than a retention performance of the target memory cell D. Preferably, the sum of the third time interval Pause3 and the fourth time interval Pause4 is 1.2-1.8 times the retention performance of the target memory cell D. Condition e, the third time interval Pause3 is less than the retention performance of the target memory cell D. Condition f, the fourth time interval Pause4 is less than the retention performance of the target memory cell D. Preferably, the third time interval Pause3 may fall within a range of 3,500 ms≤Pause3≤5,200 ms, and the fourth time interval Pause4 may fall within a range of 2,500 ms≤Pause4≤4,500 ms. In some embodiments, the third time interval Pause3 may be the same as the first time interval Pause1, and/or, the fourth time interval Pause4 may be the same as the second time interval Pause2.

In the process shown in FIG. 6, the third time interval Pause3 and the fourth time interval Pause4 follow the condition d and the condition f. If the refreshes starting from the target WL WLb by the DRAM after S1031 are not be performed on the target WL WLb through y refreshes in S1032, as the sum of the third time interval Pause3 and the fourth time interval Pause4 before and after S1032 is greater than the retention performance of the target memory cell D, charges in the capacitor of the memory cell have been consumed when the data in the target memory cell D is read in S1033. Consequently, the data cannot be read accurately from the target memory cell D. If the refreshes starting from the target WL WLb by the DRAM are performed on the target WL WLb through y refreshes, even though the sum of the third time interval Pause3 and the fourth time interval Pause4 is greater than the retention performance of the target memory cell D, charges in the capacitor of the target memory cell D are retained because the target WL WLb is refreshed in S1032 between the third time interval Pause3 and the fourth time interval Pause4 and the third time interval Pause3 and the fourth time interval Pause4 do not exceed the retention performance of the target memory cell D. Consequently, the data can be read accurately from the target memory cell D in S1033.

Further, the refresh counter y in S1032 is constantly increased, until the data can be read from the target memory cell D accurately after the refresh is performed with the modified y. The y herein can be considered as the refresh counter Y of the DRAM that the DRAM performs the refreshes just to the target WL WLb starting from the target WL WLb according to the preset rule, and the refresh counter of the DRAM that the DRAM performs the refreshes just to the preset WL WLa starting from the preset WL WLa.

To sum up, with uncertain preset WL and preset rule for refreshes of the DRAM, by writing data to a target memory cell connected with a target WL in the DRAM, controlling the DRAM to perform refreshes starting from a preset WL according to a preset rule and determining an intermediate refresh counter of refreshes on the target WL according to whether the data can be read accurately from the target memory cell after the refreshes, and controlling, based on the intermediate refresh counter, the DRAM to perform refreshes starting from the target WL according to the preset rule, and determining the refresh counter of the DRAM according to whether the data can be read accurately from the target memory cell after the refreshes, the method for determining a refresh counter of a DRAM provided by the embodiment of the present application can determine the refresh counter of the DRAM accurately, evaluate and test the DRAM more effectively according to the refresh counter, know the structure, manufacturing principle and the like of the DRAM more accurately, and has better analysis on the DRAM. For example, by analyzing the DRAM, the method can determine the quality of the DRAM according to the refresh counter of the DRAM, solve design defects of the DRAM due to the internal refresh counter, and avoid unnecessary refreshes, etc. In addition, the method can further evaluate the application mechanism of the DRAM to implement applications and innovations for the refresh counter of the DRAM, thus meeting market requirements on DRAM.

Figure 7:
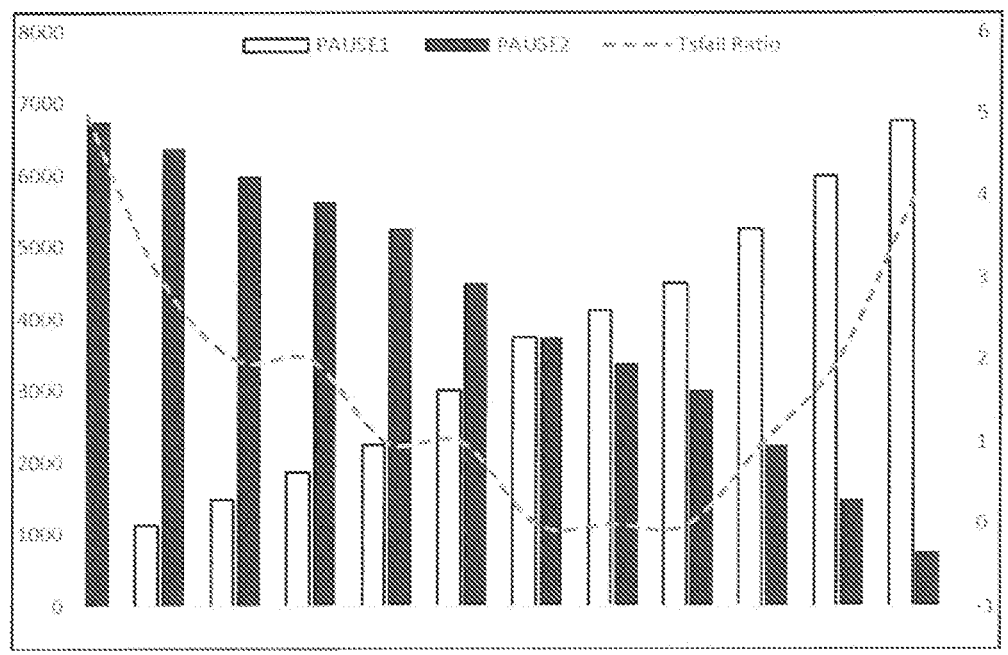
FIG. 7 is a test chart for selecting a time interval according to the present application.

FIG. 7 is a test chart for selecting a time interval according to the present application. In the histogram, the left coordinate illustrates the values of 0-7000 ms into which the first time interval Pause1 and the second time interval Pause2 fall, the right coordinate illustrates proportional parameters Tsfail Ratio corresponding to different combinations of the first time interval Pause1 and the second time interval Pause2. The proportion parameter refers to a counter that the data cannot be read accurately from the target memory cell in every 100 tests after the first time interval Pause1 and the second time interval Pause2 are selected. As can be seen, if 3,500 ms≤Pause1≤5,200 ms and 2,500 ms≤Pause2≤4,500 ms, the proportional parameter is minimum, and the data can be read more accurately from the target memory cell.

The method for determining a refresh counter of a DRAM provided by the embodiment of the present application is described in the above embodiment. In order to implement various functions in the method provided by the embodiment of the present application, the electronic device as the execution main body may include a hardware structure and/or a software module, and implement the above functions in the form of the hardware structure, the software module, or a combination of the hardware structure and the software module. Whether the functions are implemented by using the hardware structure, the software module, or the combination of the hardware structure depends on the specific application of the technical solutions and design constraints.

For example, the present application provides an apparatus for determining a refresh counter of a DRAM, which includes: a write module, configured to write data to memory cells of the DRAM; a read module, configured to read the data from the memory cells of the DRAM; a refresh module, configured to perform refreshes on a plurality of WLs of the DRAM according to a preset rule; and a determining module, configured to write data through the write module to a target memory cell connected with a target WL in the plurality of WLs; perform refreshes through the refresh module on the plurality of WLs starting from a preset WL according to the preset rule, and determine an intermediate refresh counter according to whether the data can be read from the target memory cell through the read module after a plurality of refreshes; and further control, based on the intermediate refresh counter, the DRAM to perform refreshes on the plurality of WLs starting from the target WL according to the preset rule, and determine the refresh counter of the DRAM according to whether the data can be read from the target memory cell through the read module after the refreshes.

Specific implementations and principles in various embodiments of the apparatus for determining a refresh counter of a DRAM provided by the present application may refer to the method for determining a refresh counter of a DRAM provided in the above embodiment of the present application, and will not be repeated.

It is to be noted that the division of the modules in the apparatus is merely a division of logic functions. During actual implementations, the modules may be wholly or partially integrated to a physical entity, and may also be physically separate. These modules may be implemented wholly in a form of calling software through processing elements, may also be implemented wholly in a hardware form, and may further be implemented partially in a form of calling software through processing elements and partially in a hardware form. The processing elements may be independently provided, and may also be integrated to a chip of the above apparatus. In addition, the processing elements may also be stored in a memory of the apparatus in a form of program codes. One of the processing elements in the apparatus may call and execute the functions of the above determining module. The implementations of other modules are the same. In addition, these modules can be integrated wholly or partially, and may also be implemented independently. The processing element may be an integrated circuit (IC) with a signal processing capability. During the implementation, the steps of each method or the modules may be performed through an integrated logic circuit of hardware in a processing element or through instructions in the form of software.

For example, these modules may be configured as one or more ICs for implementing the above method, such as one or more application specific integrated circuits (ASICs), or, one or more digital signal processors (DSPs), or, one or more field programmable gate arrays (FPGAs), etc. Also for example, when a module is implemented in the form of calling the program code through the processing element, the processing element may be a universal processor such as the central processing unit (CPU) or another processor capable of calling the program code. Also for example, these modules may be integrated together and implemented in a form of system-on-a-chip (SOC).

The foregoing embodiments may be implemented in whole or in part by software, hardware, firmware, or any combination thereof. When software is used to implement the functions, these functions may be implemented completely or partially in a form of a computer program product. The computer program product includes one or more computer instructions. When the computer program instructions are loaded and executed on a computer, the procedure or functions according to the examples of this application are all or partially generated. The computer may be a general-purpose computer, a dedicated computer, a computer network, or another programmable device. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital video disc (DVD)), a semiconductor medium (for example, a solid state disk (SSD)), or the like.

Figure 8:
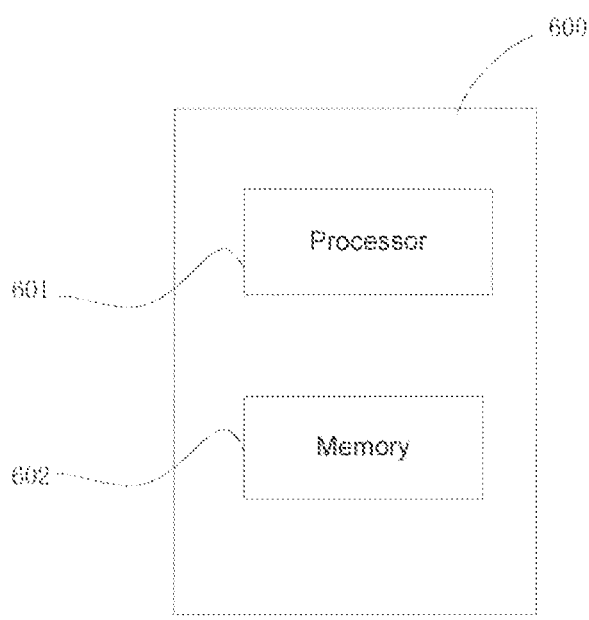
FIG. 8 is a block diagram of an apparatus for determining a refresh counter of a DRAM according to the present application.

An exemplary embodiment of the present disclosure provides an apparatus for determining a refresh counter of a DRAM. Referring to FIG. 8, the apparatus for determining a refresh counter of a DRAM 600 may be provided as a terminal device. The apparatus for determining a refresh counter of a DRAM 600 may include a processor 601, and one or more processors may be set as required. The apparatus for determining a refresh counter of a DRAM 600 may further include a memory 602 configured to store an executable instruction, such as an application program, of the processor 601. One or more memories may be set as required. The memory may store one or more application programs. The processor 601 is configured to execute the instruction to perform the foregoing method.

The present application further provides a computer-readable storage medium, wherein the computer-readable storage medium stores a computer program, and the computer program is executed to implement the method for determining a refresh counter of a DRAM in any of the above embodiments. Referring to FIG. 8, for example, the non-transitory computer-readable storage medium may be the memory 602 including instructions. The foregoing instructions may be executed by the processor 601 of the apparatus for determining a refresh counter of a DRAM 600 to complete the foregoing method.

An embodiment of the present application further provides a chip for executing an instruction. The chip is configured to implement the method for determining a refresh counter of a DRAM in any of the above embodiments.

An embodiment of the present application further provides a program product, including a computer program stored in a storage medium, wherein at least one processor may read the computer program from the storage medium, and execute the computer program to implement the method for determining a refresh counter of a DRAM in any of the above embodiments.

Those of ordinary skill in the art can understand that all or some of the steps in the foregoing method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A method for determining a refresh counter of a dynamic random access memory (DRAM), wherein the DRAM is configured to cyclically refresh a plurality of word lines in the DRAM in sequence from a preset word line according to a preset rule, and the method comprises:

writing data to a target memory cell connected with a target word line in the plurality of word lines;

controlling the DRAM to perform refreshes on the plurality of word lines starting from the preset word line according to the preset rule, and determining an intermediate refresh counter according to whether the data can be read from the target memory cell after a plurality of refreshes, wherein the intermediate refresh counter is a counter that the DRAM performs refreshes starting from the preset word line to the target word line according to the preset rule; and controlling, based on the intermediate refresh counter, the DRAM to perform refreshes on the plurality of word lines starting from the target word line according to the preset rule, and determining the refresh counter of the DRAM according to whether the data can be read from the target memory cell after the refreshes, wherein the refresh counter is a counter that the DRAM performs refreshes starting from the target word line to the target word line again according to the preset rule.

2. The method according to claim 1, wherein the controlling the DRAM to perform refreshes on the plurality of word lines starting from the preset word line according to the preset rule, and determining an intermediate refresh counter according to whether the data can be read from the target memory cell after a plurality of refreshes comprises:

controlling, after a first time interval, the DRAM to perform x refreshes on the plurality of word lines starting from the preset word line according to the preset rule;

determining, after a second time interval upon completion of an xth refresh, whether the data can be read from the target memory cell;

determining, if yes, the x as the intermediate refresh counter; and modifying, if no, the x and redetermining the intermediate refresh counter according to a modified x.

3. The method according to claim 1, wherein the controlling, based on the intermediate refresh counter, the DRAM to perform refreshes on the plurality of word lines starting from the target word line according to the preset rule, and determining the refresh counter of the DRAM according to whether the data can be read from the target memory cell after the refreshes comprises:

controlling the DRAM to perform refreshes of the intermediate refresh counter on the plurality of word lines starting from the preset word line according to the preset rule;

controlling, after a third time interval, the DRAM to perform y refreshes on the plurality of word lines starting from the target word line according to the preset rule;

determining, after a fourth time interval upon completion of a yth refresh, whether the data can be read from the target memory cell;

determining, if yes, the y as the refresh counter of the DRAM; and modifying, if no, the y and redetermining the refresh counter according to a modified y.

4. The method according to claim 2, wherein
a sum of the first time interval and the second time interval is 1.2-1.8 times a retention performance of the target memory cell;

the first time interval is less than the retention performance of the target memory cell; and the second time interval is less than the retention performance of the target memory cell.

5. The method according to claim 3, wherein
a sum of the third time interval and the fourth time interval is 1.2-1.8 times a retention performance of the target memory cell;
the third time interval is less than the retention performance of the target memory cell; and
the fourth time interval is less than the retention performance of the target memory cell.

6. The method according to claim 2, wherein the modifying the x comprises:
adding a constant a to the x to obtain the modified x, a being a natural number greater than 0.

7. The method according to claim 3, wherein the modifying the y comprises:
adding a constant b to the y to obtain the modified y, b being a natural number greater than 0.

8. The method according to claim 1, further comprising:
determining a memory cell having a retention performance at a normal temperature same as a preset retention performance as the target memory cell from memory cells of the DRAM.

9. An apparatus for determining a refresh counter of a dynamic random access memory (DRAM), comprising:
one or more processors; and
a storage apparatus, configured to store one or more programs, wherein the one or more programs, when executed by the one or more processors, cause the one or more processors to execute operations of:
writing data to memory cells of the DRAM;
reading the data from the memory cells of the DRAM;
performing refreshes on a plurality of word lines of the DRAM according to a preset rule; and
writing data to a target memory cell connected with a target word line in the plurality of word lines; and
performing refreshes on the plurality of word lines starting from a preset word line according to the preset rule, and determining an intermediate refresh counter according to whether the data can be read from the target memory cell after a plurality of refreshes, wherein the intermediate refresh counter is a counter that the DRAM performs refreshes starting from the preset word line to the target word line according to the preset rule; and
controlling, based on the intermediate refresh counter, the DRAM to perform refreshes on the plurality of word lines starting from the target word line according to the preset rule, and determining the refresh counter of the DRAM according to whether the data can be read from the target memory cell after the refreshes, wherein the refresh counter is a counter that the DRAM performs refreshes starting from the target word line to the target word line again according to the preset rule.

10. The apparatus according to claim 9, wherein the one or more programs cause the one or more processors to execute operations of:
controlling, after a first time interval, the DRAM to perform x refreshes on the plurality of word lines starting from the preset word line according to the preset rule; determining, after a second time interval upon completion of an xth refresh, whether the data can be read from the target memory cell; determining, if yes, the x as the intermediate refresh counter; and modifying, if no, the x and redetermining the intermediate refresh counter according to a modified x.

11. The apparatus according to claim 9, wherein the one or more programs cause the one or more processors to execute operations of:
controlling the DRAM to perform refreshes of the intermediate refresh counter on the plurality of word lines starting from the preset word line according to the preset rule; controlling, after a third time interval, the DRAM to perform y refreshes on the plurality of word lines starting from the target word line according to the preset rule; determining, after a fourth time interval upon completion of a yth refresh, whether the data can be read from the target memory cell; determining, if yes, the y as the refresh counter of the DRAM; and modifying, if no, the y and redetermining the refresh counter according to a modified y.

12. The apparatus according to claim 10, wherein
a sum of the first time interval and the second time interval is 1.2-1.8 times a retention performance of the memory cell;
the first time interval is less than the retention performance of the memory cell; and
the second time interval is less than the retention performance of the memory cell.

13. The apparatus according to claim 11, wherein
a sum of the third time interval and the fourth time interval is 1.2-1.8 times a retention performance of the memory cell;
the third time interval is less than the retention performance of the memory cell; and
the fourth time interval is less than the retention performance of the memory cell.

14. The apparatus according to claim 10, wherein the one or more programs cause the one or more processors to execute operations of:
add a constant a to the x to obtain the modified x, $0 \leq x \leq A$, a being a natural number greater than 0.

15. The apparatus according to claim 11, wherein the one or more programs cause the one or more processors to execute operations of:
add a constant b to the y to obtain the modified y, $0 \leq b \leq B$, b being a natural number greater than 0.

16. The apparatus according to claim 9, wherein the one or more programs cause the one or more processors to execute operations of:
determine a memory cell having a retention performance at a normal temperature same as a preset retention performance as the target memory cell from the memory cells of the DRAM.

* * * * *